United States Patent [19]

Stewart

[11] Patent Number: 4,612,466

[45] Date of Patent: Sep. 16, 1986

[54] HIGH-SPEED OUTPUT DRIVER

[75] Inventor: Roger G. Stewart, Hillsborough Township, Somerset County, N.J.

[73] Assignee: RCA Corporation, Princeton, N.J.

[21] Appl. No.: 646,102

[22] Filed: Aug. 31, 1984

[51] Int. Cl.[4] .................. H03K 17/04; H03K 17/687; H03K 19/017; H03K 5/12

[52] U.S. Cl. .................................... 307/585; 307/443; 307/451; 307/473; 307/579; 307/268; 307/270

[58] Field of Search .............. 307/473, 270, 451, 443, 307/475, 585, 575–579, 263, 268

[56] References Cited

U.S. PATENT DOCUMENTS

| | | | |
|---|---|---|---|
| 4,217,502 | 8/1980 | Suzuki | 307/473 |
| 4,329,600 | 5/1982 | Stewart | 307/270 X |
| 4,437,024 | 3/1984 | Wacyk | 307/270 X |
| 4,527,081 | 7/1985 | Stewart | 307/270 |
| 4,531,068 | 7/1985 | Kraft et al. | 307/473 |
| 4,532,436 | 7/1985 | Bismarck | 307/585 X |
| 4,533,841 | 8/1985 | Konishi | 307/451 X |

*Primary Examiner*—Larry N. Anagnos
*Attorney, Agent, or Firm*—Joseph S. Tripoli; Henry I. Schanzer

[57] ABSTRACT

The circuit includes amplifying means whose signal transfer characteristics may be varied connected between an input signal terminal and an output stage and feedback means coupled between the output stage and the amplifying means for altering the signal transfer characteristics of the amplifying means as a function of the output of the output stage. In response to an input signal making a transition from "high" to "low" causing the output stage output to go from a first level to a second level the amplifying means is set to a first condition for which it responds quickly to an input signal making a transition from "low" to "high". In response to a low-to-high transition of the input signal the output stage output goes from the second to the first level and the amplifying means is set to a second condition for which it responds quickly to a high-to-low input signal transition.

12 Claims, 7 Drawing Figures

HIGH-SPEED OUTPUT DRIVER

This invention relates to means for controlling the transfer characteristics of a circuit in order to increase the speed with which data signals are propagated through the circuit.

Many problems exist in the design of a high speed circuit. For example, in a memory system a driver circuit must transfer a signal from a high impedance, low energy, signal source (e.g. the output of a memory cell or of a sense amplifier) having an equivalent impedance of, at most, a few picofarads to a relatively large, low impedance, load having a capacitance of 50 or more picofarads within a few nanoseconds. The devices comprising the output stage of the circuit have to be made relatively large in order to "pass" (sink or source) the relatively large currents necessary to charge and discharge the load capacitance in the time required. However, using devices of large size increases delays within the circuit because of the increased capacitances associated with the devices. This presents a problem because the devices forming the input stage of the circuit are normally made small in order to decrease their input capacitance and insure compatibility with the input signal source. Since the input stage devices are small, they cannot supply the currents needed to quickly charge and discharge the internal nodes of the driver circuit. There, thus exists a problem in the contradictory requirements for: (a) large output devices and small input devices and (b) the need to have the circuit respond extremely quickly.

Known solutions for increasing the speed of response of a circuit include means for precharging the circuit into an active (linear) region in anticipation of the application of a data signal whereby, when the data is applied, the circuit can respond very quickly and its output can then be driven to a "high" level or a "low" level, or a level intermediate the "high" and "low" levels. However, additional circuitry is needed to generate a precharge or timing pulse and the dynamic power dissipation of the circuit is significantly increased.

In a circuit embodying the invention, increased speed of response is obtained by modifying the transfer characteristic of the circuit.

A circuit embodying the invention includes an input signal terminal, amplifying means coupled between the input signal terminal and an output stage, and feedback means coupled between the output of the output stage and the amplifying means for altering the transfer characteristic of the amplifying means and causing it to respond quickly to a change in the value of the input signal.

For example, in response to an input signal transition from a first binary value to a second binary value, the amplifying means, set to a first signal transfer condition, causes the circuit output to be quickly driven from a first level to a second level corresponding to the second binary value. The feedback means in response to the second level at the outputs then sets the amplifying means to a second signal transfer condition for causing the amplifying means to respond quickly to an input signal transition from the second binary value to the first binary value. An input signal transition from the second binary value to the first binary value is quickly propagated via the amplifying means and quickly drives the output stage from the second value to the first value and the feedback means then sets the feedback means to the first signal transfer condition.

In the accompanying drawing like reference characters denote like components, and FIG. 1 is a parital block, partial schematic diagram of a tri-state logic circuit embodying the invention;

Figure 1:
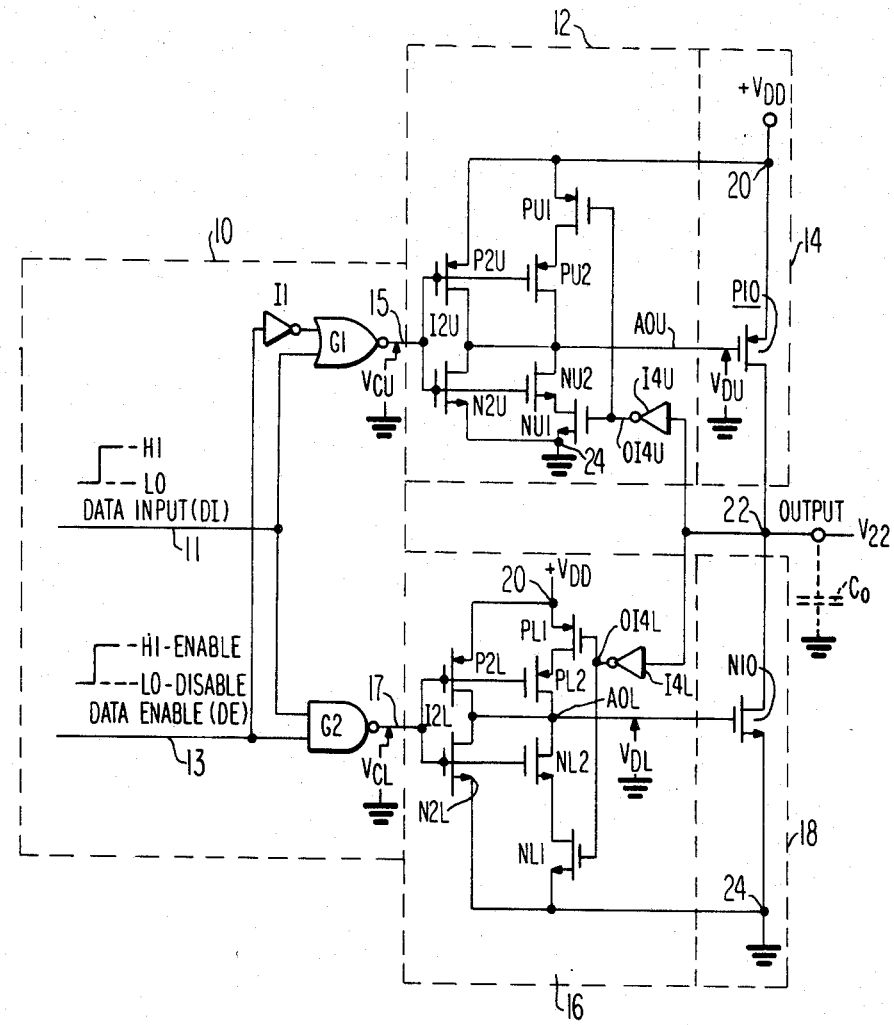

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P-conductivity type are identified by the letter P followed by a particular reference numeral, and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P-type enhancement IGFET its gate voltage ($V_G$) has to be more negative than its source voltage ($V_S$) by at least $V_T$. To turn on an N-type enhancement IGFET its $V_G$ has to be more positive than its $V_S$ by $V_T$.

3. IGFETs are bidirectional in the sense that when an enabling signal is applied to the control electrode, current can flow in either direction in the conduction path defined by the first and second electrodes, i.e. the source and drain are interchangeable.

In the discussion to follow, a potential at, or near ground is arbitrarily defined as a logic "0" or "low" condition and any potential at or near $+V_{DD}$ or $+V$ volts is arbitrarily defined as a logic "1" or "high" condition.

The circuit of FIG. 1 includes an input control section 10, a pull-up amplifying section 12, a pull-up driver 14, a pull-down amplifying section 16, and a pull-down driver 18.

Figure 2A:
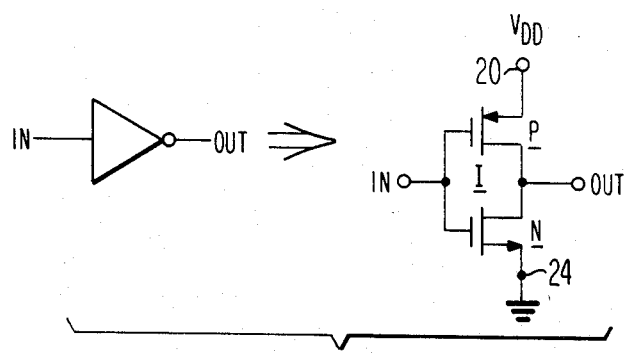
FIGS. 2A, 2B and 2C are schematic diagrams of a complementary inverter, a complementary NOR gate and a complementary NAND gate, respectively, suitable for use in the circuit of FIG. 1.
Figure 2B:
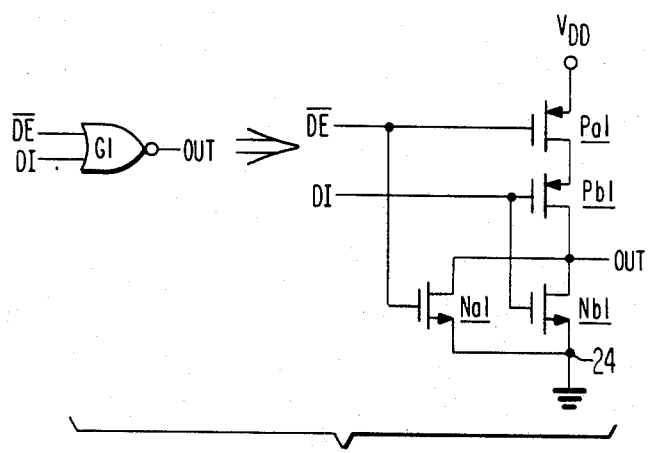
Figure 2C:
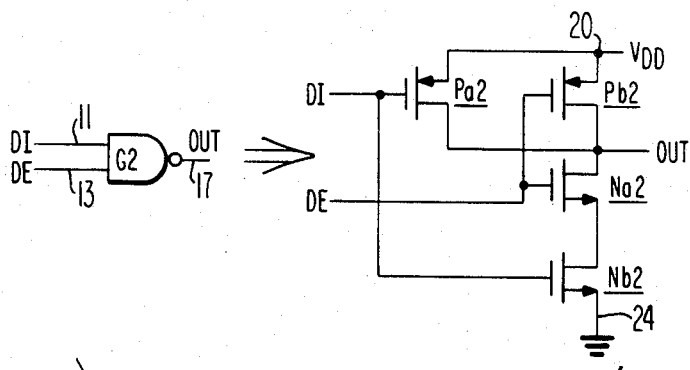

The input control section 10 has two signal output lines 11 and 13 and two signal output lines 15 and 17. Input line 11 is a data input (DI) line and line 13 is a data enable (DE) line. Input control section 10 includes an inverter I1, a two input NOR GATE G1, and a two input NAND gate G2. Inverter I1 as well as the other inverters of FIG. 1, and gates G1 and G2 may be formed with transistors of complementary conductivity type as shown in FIGS. 2A, 2B, and 2C, respectively. But, it should be evident that other suitable devices providing the same logic functions may be used instead. The DE signal is applied to the input of inverter I1 and to one input of gate G2. The output of inverter I1 is applied to one input of gate G1. The DI signal is applied to the other inputs of gates G1 and G2. The ouput (VCU) of gate G1 is coupled via line 15 to the input of an inverter I2U and to the gate electrodes of IGFETs PU2 and NU2 in pull-Up section 12. The output (VCL) of gate G2 is coupled via line 17 to the input of an inverter I2L and to the gate electrodes of IGFETs PL2 and NL2 in pull-Low section 16.

Each one of amplifying sections 12 and 16 includes a first network comprised of transistors of P-conductivity type connected between the positive power supply line 20 and the amplifying output, AOi, (where i is either U or L) and a second network comprised of transistors of N-conductivity type connected between the amplifier output (AOi) and the ground line 24.

The first network of each amplifying means includes two parallel conduction paths connected between terminals 20 and AOi. One path is comprised of the conduction path of P2i and the other path is comprised of Pi1 and Pi2 having their conduction paths connected in series. The gate electrodes of P2i and Pi2 are driven by a signal VCi, (when i is U or L) which is directly related to the input signal (when DE is high) while the gate electrode of Pi1 is connected to the output (OI4i) of an inverter I4i which is driven from the circuit output 22.

The second network of each amplifying means also includes two parallel paths connected between terminals AOi and 24 which is grounded. The conduction path of IGFET N2i defines one path. The conduction paths of Ni1 and Ni2 connected in series between AOi and terminal 24 define the second path. The gate electrodes of N2i and Ni2 are driven by VCi, while the gate electrode of Ni1 is connected to the output (OI4i) of an inverter I4i.

Each amplifying means may also be viewed as a complementary inverter (I2i) comprised of complementary IGFETs (P2i and N2i) across whose output is connected a network (Pi1, Pi2, and Ni1, Ni2) for controlling the conductivity of the inverter as a function of the output and the input signal transition.

The output AOU of amplifying section 12 is connected to the gate electrode of pull-up transistor P10 while the output AOL of amplifying section 16 is connected to the gate electrode of pull down transistor N10. The conduction path of P10 is connected between terminals 20 and 22, while the conduction path of N10 is connected between terminal 22 and 24. The load connected to output point 22 may include capacitance, represented by (o), which may be in the order of 50 picofarad, for example.

The signals on the input and output lines of control circuit 10 can assume either one of two binary values. When the DE signal is "low" the voltage ($V_{15}$) on line 15 is low and the voltage ($V_{17}$) on line 17 is high, regardless of the value of the DI signal, as set forth in TABLE 1 below. For this input signal condition, the output AOU is high causing P10 to be turned-off and the output AOL is low causing N10 to be turned-off. Consequently, the output 22 of the driver circuit "floats", being neither clamped to $V_{DD}$ nor to ground. Thus, when DE is low, the output impedance of the circuit looking into terminal 22 is extremely high. This "mode" or "state" defines one of the three states of the tri-state logic circuit.

The gross behavior of the circuit in response to input signal will first be explained. When the DE signal is high the output of inverter I1 is low. The "low" output of I1 applied to one input of NOR gate G1 causes G1 to function as an inverter in response to the D1 signal applied to its other input. Concurrently, DE high applied directly to one input of NAND gate G2 causes G2 to function as an inverter in response to the DI signal applied to its other input. Thus when DE is high, the respective outputs, VCU and VCL, of gates G1 and G2, are equal to each other and are equal, logically, to the complement or inverse of the DI signal.

When VCU and VCL are high (i.e. DI is "low") the respective outputs AOU and AOL of amplifying means 12 and 16, are driven low causing P10 to be turned-on and N10 to be turned-off, whereby the voltage ($V_{22}$) at output terminal 22 is clamped to $V_{DD}$. When VCU and VCL are low (i.e. DI is "high") AOU and AOL are driven high causing P10 to be turned-off and N10 to be turned-on whereby $V_{22}$ is clamped to ground. Thus, when the DE signal is "high" the output 22 is the logical inverse of DI. If the DI signal is high (with DE-High) VCU and VCL are low, and the output 22 is to be clamped to ground potential. For DI low (with DE-High) VCU and VCL are high, and the output 22 is to be clamped to $V_{DD}$ volts.

TABLE I

| DE | DI | VCU or $V_{15}$ | AOU | P10 | VCL or $V_{17}$ | AOL | N10 | $V_{22}$ |
| --- | --- | --- | --- | --- | --- | --- | --- | --- |
| LO | HI | LO | HI | OFF | HI | LO | OFF | FLOATING |
| LO | LO | LO | HI | OFF | HI | LO | OFF | FLOATING |
| HI | LO | HI | LO | ON | HI | LO | OFF | $V_{DD}$ (Hi) |
| HI | HI | LO | HI | OFF | LO | HI | ON | $G_{ND}$ (Lo) |

The detailed operation of the circuit highlighting the mechanism for quickly turning-on and off the output transistors will now be examined.

I. When DE is high and DI is high outputs VCU and VCL are "low". VCU-low causes P2U to be turned-on and N2U to be turned-off. Hence AOU is driven "high" (i.e. at, or close to, $V_{DD}$ volts). When AOU is high P10 is turned-off.

VCL-low causes P2L to be turned-on and N2L to be turned-off. The turn-on of P2L drives AOL high (i.e. at, or close to $V_{DD}$ volts) causing N10 to be turned-on.

The turn-on of N10 causes the output 22 to be driven or clamped "low" (i.e. at, or close to, zero volts). Since AOU is high and P10 is turned-off there is no question that N10 can pull or clamp the output terminal to ground.

When the voltage ($V_{22}$) at output terminal 22 is at ground potential the outputs (OI4U and OI4L) of inverters I4U and I4L are "high" (i.e. at, or close to, $V_{DD}$ volts).

The respective high outputs of I4U and I4L cause PU1 and PL1 to be turned-off and NU1 and NL1 to be turned-on. Amplifying means 12 and 16 may then be represented as shown in FIG. 3A. As noted above, since VCi (where i may be U or L) is low, P2i is turned-on and N2i and Ni2-are turned-off. Consequently AOi is high. AOi-high causes $V_{22}$ to be low and the outputs (OI4U and OI4L) of inverters I4i to be high. Hence the Ni1 transistors are turned-on and the Pi1 transistors are turned-off and their series branches are disconnected from the circuit and need not be shown.

The feedback (OI4i) from the output turning-on NU1 and NL1 and turning-off PU1 and PL1 primes the circuit such that when DI subsequently makes a transition from high-to-low, the change in the input signal is very quickly propagated via amplifying means 12 and 16 to the gate electrodes of P10 and N10.

Thus, although for the condition of DI remaining in the high state (with DE-high), the circuit remains in the condition described above, dissipating no power (except for leakage) it is poised to respond quickly to an input signal change as described below.

II. The operation of the circuit for the condition where the data input (DI) makes a transition from high-to-low will now be explained. When DI goes from high-to-low, the respective outputs, VCU and VCL of gates G1 and G2 go from their previously "low" state to their "high" state.

The response of amplifying means 12 and 16 to the change in VCU and VCL is best explained by reference to FIG. 3A. Recall that, as a result of DI having previously been high, $V_{22}$ is still low, OI4i is still high, and Ni1 is turned-on. Thus, when VCi goes from low-to-high P2i is being turned-off while N2i and Ni2 are being turned-on with Ni1 already fully-on.

Figure 4:
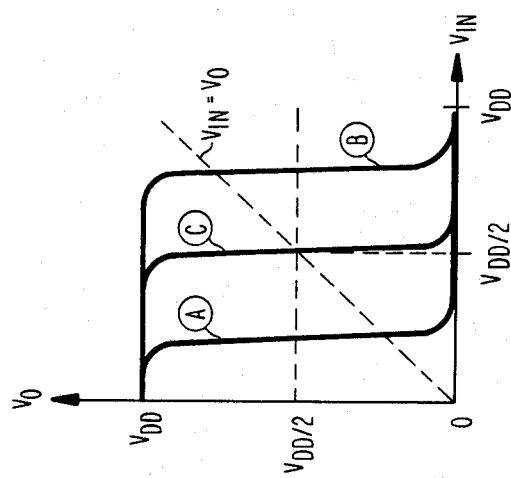
FIG. 4 is an idealized diagram of the transfer characteristics of the amplifying means of FIG. 1 for different signal conditions.

Amplifying means 12 and 16 then appear as highly skewed inverters. That is, the net impedance of the N devices connected between the output AOi and ground is significantly lower (hence their conductivity is significantly greater) than the net impedance of the P devices (whose conductivity is less) connected between AOi and $V_{DD}$. Such an inverter responds much faster to the VCi signals making a transition from low-to-high than to the VCi signals making a transition from high-to-low. The transfer characteristic of such an inverter is shown as waveform A in FIG. 4. Virtually, as soon as VC ($V_{IN}$) rises above the threshold voltage ($V_T$) of the N type transistors (N2i and Ni2) they begin to conduct causing the output AOi to drop quickly towards ground potential. Thus, very shortly after DI makes a transition from high-to-low, VCU and VCL goes from low-to-high and as soon as VCU and VCL start going from low-to-high, AOU and AOL are driven low.

As soon as AOU and AOL are driven low P10 is turned-on and N10 is turned-off. When that occurs P10 charges terminal 22 towards $V_{DD}$ unimpeded by N10 which is turned-off.

As $V_{22}$ is being driven from ground towards $V_{DD}$ and passes $V_{DD/2}$, the switching point of inverters I4U and I4L is reached and their outputs (OI4U and OI4L) are driven from high-to-low. Inverters I4U and I4L are balanced (i.e. they are not skewed) in that this output switches high or low when their input goes slightly above or slightly below $V_{DD/2}$. This transfer characteristic would typically be of the type represented by waveform C in FIG. 4. When OI4U and OI4L go low amplifying means 12 and 16 are switched to a new condition which may be represented by the circuit shown in FIG. 3B. However, note that when OI4U and OI4L are switched low the output ($V_{22}$) of the circuit is already at or close to its desired state (e.g. high) and will remain in that state so long as DI is low.

As soon as OI4U and OI4L are switched low amplifying means 12 and 16 are set to a condition which causes them to respond faster to the next transition (change) of the input signal.

Figure 3B:
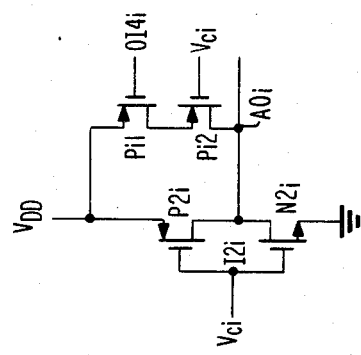
FIGS. 3A and 3B, are equivalent schematic diagram representations of the amplifying means of FIG. 1 for different signal conditions.
Figure 3A:
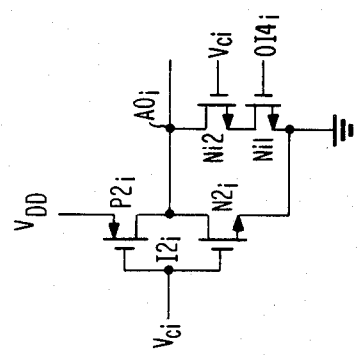

This is illustrated by FIG. 3B which represents the condition of the amplifying means when DI is low, DE is high and $V_{22}$ has been driven high.

When DI is low, VCi (VCU and VCL) is high whereby P2i and Pi2 are turned-off, while N2i is turned-on. Since $V_{22}$ is high, OI4i is low and Pi1 is turned-on. However, since VCi is high, Pi2 remains turned-off. Thus in the steady state condition following the transition of DI to the "low" level, amplifying means 12 and 16 are poised to respond quickly to a low-to-high transition of DI.

III. The response of the circuit to the condition when DI makes a transition from low-to-high (with DE-high) will now be examined. When DI goes from low-to-high, the outputs VCU and VCL of gates G1 and G2 go from high-to-low. As soon as VCU and VCL begin to go from high-to-low, the outputs AOU and AOL of amplifying means 12 and 16 are driven high. This is best explained by reference to FIG. 3B. As soon as VCi begins to go low, and decreases to $V_T$ volts below $V_{DD}$, P2i and Pi2 are turned-on. Recall that OI4i is low and that Pi1 is fully turned-on. Hence, the effective iimpedance of the P devices connected between AOi and $V_{DD}$ is much less than the effective impedance of the N devices connected between AOi and ground. Thus, as illustrated in waveform B of FIG. 4 and in accordance with the transfer characteristic of the amplifying means, the outputs AOU and AOL are quickly driven towards $V_{DD}$ as soon as VCU and VCL begin to go from high-to-low. As soon as the high level at AOU and AOL is applied to the gate electrodes of P10 and N10, P10 gets turned-off and N10 gets turned-on. N10 can then very quickly discharge terminal 22 to ground. Of course, as $V_{22}$ is driven towards ground and passes $V_{DD/2}$ inverters I4U and I4L are switched and their outputs are driven high. The amplifying means 12 and 16 are then set to the condition described above and illustrated in FIG. 3A.

It has thus been shown that, whenever the output of the circuit is driven to the condition corresponding to a given input signal level, the amplifying means is set to a condition which will enable it to respond very quickly to a change in the input signal. This enables the circuit to respond very quickly to the input signal.

Observe that in the steady state only one transistor of each amplifying means provides a low impedance path between the output (AOi) and either ground or $V_{DD}$. It is only during a signal transition from high-to-low or low-to-high that the effective impedance of the inverters is altered to enable and enhance high speed propagation.

A low impedance path is thus momentarily generated to quickly charge or discharge a node driving the gate of an output transistor. Thus, high speed of response is achieved with a relatively low power dissipation circuit.

The circuit has been illustrated using transistors of complementary conductivity type. However, it should be evident that the invention may be practiced using transistors of single conductivity type.

Note also that other means responsive to the output voltage (i.e. $V_{22}$) of the output stage could be used to alter the signal propagation characteristics between the output of the control section 10 and the gate electrodes of the output transistors (P10 and N10). These means could include, for example, means for controlling the substrate voltage of transistors P2U, N2U, P2L and N2L. Alternatively, transistors of different thresholds or conductivity type could be used to obtain or produce the desired different switching characteristics of the amplifying means.

What is claimed is:

1. The combination comprising:
    a signal input terminal adapted to receive input signals having a first or a second value;
    an output stage having a signal input and a signal output;
    amplifying means coupled between said input terminal and said signal input of said output stage for driving said output stage and for producing at said signal output either a first level in response to one value of said input signal or a second level in response to the other value of said input signal, said amplifying means being settable to either a first condition for which it responds faster to an input signal transition from said first to said second value than to a transition from said second to said first value, or to a second condition for which it responds faster to an input signal making a transition from said second to said first value; and
    feedback means coupled between said signal output and said amplifying means responsive to the level at said signal output for setting said amplifying means to either one of said first and second conditions, depending on the level at said signal output.

2. The combination as claimed in claim 1 wherein said feedback means is responsive to the signal at said signal output being at a level corresponding to said first value of input signal for setting said amplifying means to said first condition and to the signal at said signal output being at a level corresponding to said second value of input signal for setting said amplifying means to said second condition.

3. The combination as claimed in claim 2 wherein said amplifying means includes:
    (a) an inverter having an input coupled to said signal input terminal and an output coupled to said signal input of said output stage; and
    (b) impedance modifying means coupled to the output of said inverter; and wherein said feedback means is coupled between said signal output of said output stage and said impedance modifying means for altering the effective output impedance of said amplifying means.

4. The combination as claimed in claim 2 wherein said output stage includes:
    (a) first and second power terminals for the application therebetween of an operating potential;
    (b) a first transistor having source and drain electrodes defining the ends of a conduction path and a control electrode;
    (c) means connecting the conduction path of said first transistor between said signal output of said output stage and said first power terminal for driving said signal output point to the potential at said first power terminal when said first transistor is turned-on; and
    (d) load means coupled between said signal output and said second power terminal for coupling the potential at said second power terminal to said signal output; and
    wherein said control electrode of said first transistor is connected to said signal input of said output stage.

5. The combination as claimed in claim 4 wherein said amplifying means includes an inverter having an input coupled to said signal input terminal and an output coupled to the control electrode of said first transistor and impedance modifying means coupled between the output of the inverter and each one of said first and second power terminals; and
    wherein said feedback means is coupled between said signal output of said output stage and said impedance modifying means.

6. The combination as claimed in claim 5 wherein said load means includes a second transistor having source and drain electrodes defining the ends of a conduction path and a control electrode, and wherein said second transistor is of opposite conductivity type to the conductivity of said first transistor;
    wherein the conduction path of said second transistor is connected between said signal output of said output stage and said second power terminal; and
    wherein the control electrode of said second transistor is coupled via a second amplifying means to said signal input terminal.

7. The combination as claimed in claim 6 wherein said second amplifying means is coupled between said input terminal and said control electrode of said second transistor for turning-on said second transistor for said other value of said input signal and for turning-off said second transistor for said one value of said input signal; said second amplifying means being settable to either one of first and second conditions, said second amplifying means when set to said first condition responding faster to an input signal making a transition from said first to said second value, and when set to said second condition responding faster to an input signal making a transition from said second to said first value; and
    feedback means coupled between said signal output of said output stage and said second amplifying means for setting said second amplifying means to either one of said first and second conditions.

8. The combination as claimed in claim 7 wherein each one of said amplifying means includes:
    (a) an inverter having a signal input coupled to said signal input terminal and a signal output coupled to the control electrode of its corresponding one of said first and second transistors;
    (b) first and second impedance modifying transistors having their conduction paths connected in series between said inverter signal output and said first power terminal;
    (c) third and fourth impedance modifying transistors having their conduction paths connected in series between said inverter signal output and said second power terminal;

(d) means coupling the control electrodes of the first and third impedance modifying transistors to the signal input of its corresponding inverter; and wherein said feedback means includes means coupled to the control electrodes of said second and fourth impedance modifying transistors of each amplifying means.

9. The combination comprising:

first and second points for the application therebetween of an operating potential;

first and second transistors of first and second conductivity type, respectively, each transistor having a conduction path and a control electrode; means connecting their conduction paths in series between said first and second points;

an output terminal connection between the conduction paths of said first and second transistors;

a data input terminal, and a control input terminal;

amplifying means coupled between said data input terminal and the control electrodes of said first and second transistors for, in response to one value of signal at said data input terminal, turning-on said first transistor and turning-off said second transistor and for, in response to another value of signal at said data input terminal, turning-off said first transistor and turning-on said second transistor;

said amplifying means being settable to either one of first and second conditions, said amplifying means when set to said first condition responding faster to an input signal making a transition from said first to said second value, and when set to said second condition responding faster to an input signal making a transition from said second to said first value; and feedback means responsive to the value of the signal at said output terminal, coupled between said output terminal and said amplifying means, for setting said amplifying means to either one of said first and second conditions as a function of the value of the signal at said output terminal.

10. The combination as claimed in claim 9 wherein said first and second transistors are insulated-gate field-effect transistors (IGFETs) of complementary conductivity type.

11. The combination comprising:

a signal input terminal adapted to receive input signals having a first or a second value;

first and second power terminals for the application therebetween of an operating potential;

an output point;

a first transistor having source and drain electrodes defining the ends of an conduction path and a control electrode;

means connecting the conduction path of said first transistor between said output point and said first power terminal for driving said output point to the potential at said first power terminal when said first transistor is turned-on;

load means coupled between said output point and said second power terminal for selectively applying the potential at said second power terminal to said output point;

amplifying means coupled between said input terminal and said control electrode of said first transistor, said amplifying means turning-on said first transistor for one value of said input signal and turning-off said first transistor for the other value of said input signal; said amplifying means being settable to either one of first and second conditions, said amplifying means when set to said first condition responding faster to an input signal making a transition from said first value to said second value and when set to said second condition responding faster to an input signal making a transition from said second to said first value; and feedback means, coupled between said output point and said amplifying means, responsive to the level at said output point for setting said amplifying means to either one of said first and second conditions as a function of the level at said output point.

12. The combination as claimed in claim 11 wherein said feedback means is responsive to the signal at said signal output point being at a level corresponding to said first value of input signal for setting said amplifying means to said first condition and to the signal at said output point being at a level corresponding to said second value of input signal for setting said amplifying means to said second conditions.

* * * * *

UNITED STATES PATENT AND TRADEMARK OFFICE
CERTIFICATE OF CORRECTION

PATENT NO. : 4,612,466
DATED : Sep. 16, 1986
INVENTOR(S) : Roger G. Stewart

It is certified that error appears in the above-identified patent and that said Letters Patent is hereby corrected as shown below:

Col. 3, line 3, change "output" to - - - input - - -.
Col. 6, line 54, change "the" (second occurrence) to
- - - a - - -.

Signed and Sealed this

Second Day of December, 1986

Attest:

DONALD J. QUIGG

*Attesting Officer*   *Commissioner of Patents and Trademarks*